United States Patent [19]

Reimer

[11] Patent Number: 4,641,224
[45] Date of Patent: Feb. 3, 1987

[54] ELECTROMAGNETIC INTERFERENCE REDUCING ASSEMBLY

[75] Inventor: William A. Reimer, Wheaton, Ill.

[73] Assignee: GTE Communication Systems Corporation, Northlake, Ill.

[21] Appl. No.: 758,901

[22] Filed: Jul. 25, 1985

[51] Int. Cl.⁴ .............................................. H05K 9/00
[52] U.S. Cl. ................................ 361/424; 174/35 R; 333/12
[58] Field of Search ....................... 361/424, 395, 399; 174/35 R, 35 MS; 333/12, 167, 181, 182, 184, 185

[56] References Cited

U.S. PATENT DOCUMENTS

| | | | |
|---|---|---|---|
| 2,835,874 | 5/1958 | First et al. | 174/35 R |
| 3,939,444 | 2/1976 | Hollyday | 361/424 |
| 4,408,171 | 10/1983 | Akino | 333/185 |
| 4,498,946 | 2/1985 | Peterson | 361/424 |

Primary Examiner—G. P. Tolin
Attorney, Agent, or Firm—Robert J. Black

[57] ABSTRACT

An assembly to reduce propagation of electromagnetic interference from an equipment enclosure via cable conductors passing out of the enclosure including a capacitor connected to each corresponding conductor and to the enclosure. The capacitors are mounted on an insulating substrate to which is fixed a conductive layer. The capacitors, the support plate, and the conductive layer are contained in a housing attached to the equipment enclosure. A second enclosure is provided, received within the housing and is equipped with a pair of clamps to retain the cables connected to the capacitors from both outside of and within the equipment enclosure.

20 Claims, 5 Drawing Figures

ELECTROMAGNETIC INTERFERENCE REDUCING ASSEMBLY

BACKGROUND OF THE INVENTION

1. Field of the Invention

The present invention relates to electromagnetic interference reducing apparatus and, more particularly, to an assembly for reducing the amount of electromagnetic interference escaping from an equipment enclosure out of which pass a plurality of electrical conductors.

2. Background Art

Many electronic systems are known which emit electromagnetic radiation in their operation. Such radiation is also known, depending on its nature, to affect other electronic systems. In order to control electromagnetic interference between electronic systems, the various government agencies have specified maximum levels of electromagnetic radiation emissions which may be allowed. These levels must be met for the equipment to be sold. An optimum method for restricting electromagnetic emissions is to totally enclose the electronic system in a shielded housing thereby restricting all emissions there from.

In the area of certain types of systems with widely separated elements such as telephone switching system, total sytem enclosure is not possible because subscriber related wiring must leave the system enclosure. In such conditions, allowable levels of emissions have been found obtainable by treating the individual wiring conductors to remove electromagnetic interference traveling on them before the conductors leave the enclosure. A common way to treat such conductors is to capacitively couple the individual conductors to the enclosure at the point they pass through a wall of the enclosure. In this regard, it is known to provide capacitive bypassing in the form of an array of feed through capacitors mounted in a conductive plane and having a first feed through terminal on a inner surface, a second feed through terminal on the outer surface and having a ground sleeve connected to the enclosure wall. A plurality of conductors passing out of the enclosure are first terminated to the inner feed through terminals. A corresponding plurality of second conductors are then connected to the outer feed through terminals and routed to the subscribers' telephone equipment. Such an arrangement, while operating generally satisfactorily, requires the individual manual connection of conductors on the feed through assembly mounted to the enclosure.

Another known method of treating conductors passing out of an enclosure to subscribers' telephone equipment is to mount a plurality of capacitors on a printed wiring board which is then mounted to an inner surface of a wall of the enclosure by means of screw fasteners. A first printed conductor on the board provides a circuit path to connect a first terminal of each of the capacitors to the enclosure wall and a plurality of second circuit conductors connect a second terminal of each of the capacitors to a corresponding first and second plated-through hole. The free ends of the conductors passing out of the enclosure and then soldered to a corresponding first plated-through hole. A second cable is provided and connected between the second plated-through hole and the equipment within the enclosure. Such an arrangement while operating generally satisfactorily requires the separate assembly of capacitors and printed wiring card to the enclosure and the assembly of the cables to the printed wiring card mounted within the enclosure.

The above arrangements have generally been found to be bulky, expensive and costly to install, and in the case of the printed wiring card of reduced effectiveness due the placement of treating capacitors at a less than ideal position for effective electromagnetic interference reduction.

SUMMARY OF THE INVENTION

The present invention provides an improved method of connecting electromagnetic interference reducing capacitors to conductors passing out of an equipment enclosure utilizing a non-conductive support plate on the opposite sides of which are formed a pair of conductive layers. The conductive layers are connected to a wall of the enclosure and each includes a plurality of apertures spaced about its surface. Within each of the apertures is formed a second conductive pad which is insulated from the associated conductive layer. A plurality of electromagnetic interference reducing capacitors are attached to the conductive layer via a first terminal and to a respective one of the pads via a second terminal, connection to the surfaces and the pads being provided for electrical reasons and for structural support. A respective one of each of the conductors passing out of the enclosure is connected to each of the capacitors second terminals to provide treatment of the conductors to reduce electromagnetic interference carried on the conductors thereby preventing the interference from escaping from the enclosure on the conductors.

Connection of the conductive layers to the enclosure wall is achieved by an electrically conductive housing connected to the enclosure wall. A wire is provided and connected between each of the conductive layers and the housing to complete the electrical connection between the conductive layer and the enclosure.

Alternately, the conductive layers may each be formed on a flexible support layer, which layers are then rolled up toward each other to form a resilient coil urging the conductive layer into direct electrical contact with the housing. The housing may be positioned on an inner side of the enclosure wall to prevent damage to the enclosure and to improve electromagnetic interference reduction. The housing may be adapted to removably receive and support the support plate, the conductive layers and the electromagnetic interference reducing capacitors.

An insulating alignment guide for the conductors is provided to position the conductors in contact with the capacitor second ends to thereby facilitate connection of the conductors with the capacitors.

In an alternate embodiment, insulation displacing terminals are each connected to an associated capacitor second end via a corresponding conductor pad attached to the support plate and are used to establish electrical connection between the conductors and the capacitor second ends. In this regard, the conductor alignment guide is used to position conductors for assembly in the terminals. The alignment guide is then pressed towards the support plate to engage the conductors with the terminals displacing the conductor insulation thereby establishing electrical connection therebetween.

The insulation terminals may be alternately arranged to accept a pair of conductors, the first inserted conductor connected to equipment within the enclosure and the second conductor connected to equipment external to the enclosure.

Finally, the assembly of the present invention may include an enclosure of non-conductive material, rectangular in shape, of split identical construction and sized to fit within the housing. The enclosure is adapted at opposite ends to accept and clamp the cable passing out of the enclosure. Formed inwardly of each of the cable clamps there is provided a wire distribution channel wherein individual cable conductors may be distributed to the alignment guide conductor slots. Laterally formed in an inner surface of each enclosure half is a receiving channel adapted to accept the alignment guides.

BRIEF DESCRIPTION OF THE DRAWING

A better understanding of the present invention maybe had by consideration of the following description taken in conjunction with the accompanying drawing in which.

DESCRIPTION OF THE PREFERRED EMBODIMENTS

Figure 1:
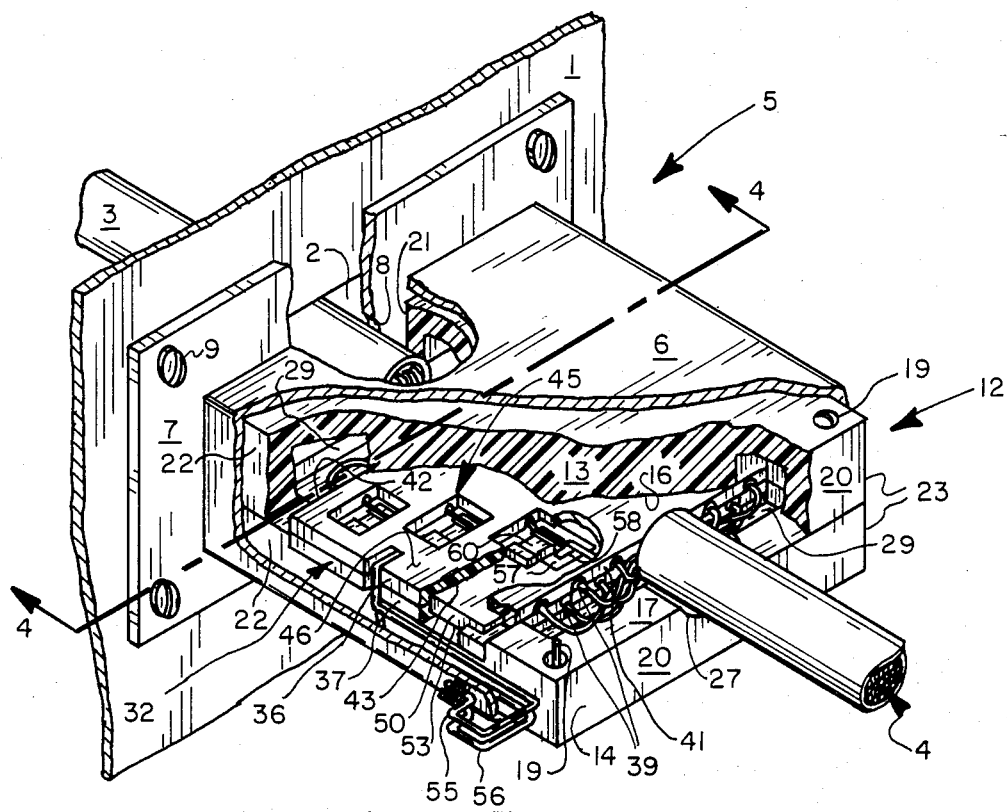
FIG. 1 is a perspective view of the present invention.

Referring now to FIG. 1 there is shown an electromagnetic interference reducing assembly in accordance with the present invention attached to a wall 1 of an enclosure containing electromagnetic interference generating equipment (not shown). An opening 2 is provided in the wall 1 to permit a cable 3 including conductors 4 to pass there through to external equipment (also not shown). A housing 5 including a sleeve 6 of rectangular construction attached to a flange 7 is provided. The flange 7 includes an opening 8 in the flange 7 just large enough to permit passage of the cable 3 there through. The flange 7 is attached to the wall 1 by means of removable fasteners 9 such as screw fasteners.

An enclosure 12 is provided including an upper half 13 and an identical lower half 14. Each of the halves 13 and 14 including an inner surface 16 and 17, respectively. The enclosure halves are fastened together by a plurality of removable fasteners 19 such as screws. The upper half 13 and the lower half 14 of the enclosure 12 are each of rectangular construction including an inner wall 20, an outer wall 21, a left side wall 22 and a right side wall 23. Within each of the halves 13 and 14 of the enclosure 12 there is formed, adjacent to the inner wall 20 and outer wall 21, a cable clamping area 27. Inward of the cable clamping area 27 within each enclosure half is formed a wire distribution channel 29.

A wire alignment guide channel 32 is formed in each of the halves 13 and 14 of the enclosure 12 extending laterally between the left side surfaces 22 and right side surfaces 23. The channels 32 open laterally into each of the wire distribution channels 29.

An upper wire alignment guide 36 and a lower wire alignment guide 37 are provided within the channels 32, each of the guides 36 and 37 including a plurality of conductor guide slots 39 extending in a longitudinal direction from an inner edge 41 to an outer edge 42 of the alignment guides 36 and 37, the conductor guide slots 39 opened toward an inner surface 43 of guides 36 and 37. A plurality of apertures 45 are provided, each extending from the inner surface 43 of the alignment guides 36 and 37 to an outer surface 46, each intersecting a corresponding one of the conductor guide slots 39.

Figure 2:
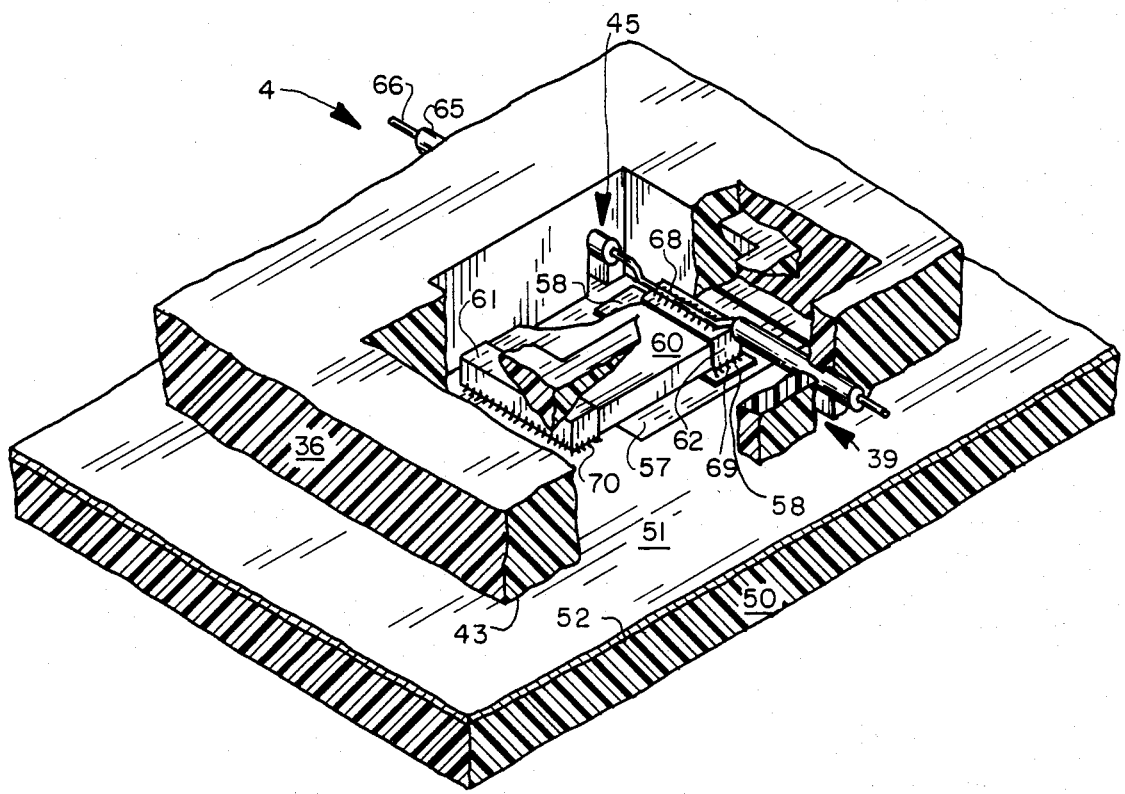
FIG. 2 is a perspective view of a first embodiment showing capacitor connection and wire guide details.

A support plate 50 of electrically insulating material is provided including an upper conductive layer 51 formed on an upper surface 52 thereof (see FIG. 2). Similarly a lower conductive layer 53 is formed on a lower 54 surface thereof (not shown). The conductive layers 51 and 53 are each connected to the housing sleeve 6 by corresponding ground wires 55 and 56. The ground wires 55 and 56 may be connected to the conductive layers 51 and 53 and to the sleeve 6 of the housing 5 by means of soldered connections. Each of the conductive layers 51 and 53 includes a plurality of apertures 57 formed therein. The apertures 57 are spaced about the conductive layers 51 and 53. A pad 58 is formed within each of the apertures 57 on the upper surface 51 and lower surface 54 of the support plate 50. The pads 58 are not electrically connected with the conductive layers 51 and 53.

Referring now to FIGS. 1 and 2, a plurality of capacitors 60 are included, each capacitor including a first terminal 61 connected to a corresponding one of the conductive layers 51 or 53 and a second terminal 62 connected to a respective one of the pads 58. The cable conductors 4 may have their insulation 65 selectively stripped off in the vicinity of the second contact 62 of the capacitors 60 exposing the metallic conductors 66 located therein.

Referring now to FIG. 2, the metallic conductor 66 is connected to the second terminal 62 of the capacitor 60 by any means known to the those skilled of the art. In this regard, the metallic conductor 66 may be connected to the second terminal 62 of the capacitor 60 by means of a soldered connection 68. The second terminal 62 and the first terminal 61 may be additionally connected to the pad 58 and the conductive layer 51 also by means of soldered connections 69 and 70, respectively.

Continuing to refer to FIGS. 1 and 2, the present invention may be operated by passing the cable 3 through the opening 2 in the equipment enclosure wall 1. The cable 3 is then threaded through the opening 8 in the flange 7 and the sleeve 6 of the housing 5, and the conductors 4 terminated to the electromagnetic interference generating equipment (not shown) within the enclosure. The housing 5 is then fastened to the inner surface of the enclosure wall 1.

The conductors 4 of the cable 3 are then exposed at the point the cable passes out of the equipment enclosure through the wall 1 by removing the cable outer jacket insulation. The individual conductors are separated, selectively stripped of the insulation 65 to expose the metallic conductors 66 and each is placed within a different one of the conductor guide slots 39 of the wire alignment guides 36 and 37 with the exposed conductor 66 positioned within the respective aperture 45. An assembly is prepared consisting of the support plate 50, the conductive layers 51 and 53 to which have been attached a plurality of the capacitors 60 with the first terminal 61 of each capacitors connected to a corresponding one of the conductive layers 51 and 53 and the second terminal 62 of each of the capacitors 60 connected to a corresponding one of the pads 58. The prepared assembly is inserted between the guides 36 and 37 and guides closed about the assembly to thus position each of the metallic conductors 66 in contact with a respective one of the second terminals 62. The conductors 66 are then electrically connected to the second terminal 62 by means generally known in the art. In this regard, the conductors 66 may be joined to the second terminal 62 by means of soldering. The ground wires 55 and 56 may then be electrically connected to the conductive layers 51 and 53 also by known means such as soldering.

Next, the subassembly thus assembled may be enclosed within the upper half 13 and the lower half 14 of the enclosure 12 and the enclosure halves secured to each other with the fasteners 19. As the enclosure halves are assembled, care is necessary to insure that the cable 3 is properly positioned to engage the cable clamps 27 and also to insure that the conductors 4 are properly positioned within the wire distribution channels 29.

Finally, following fastening of the enclosure halves 13 and 14 together as described above, the assembly just built is slid into the sleeve 6 of the housing 5 and the ground wires connected to the housing 5 by known means such as soldering to complete assembly and insulation of the electromagnetic interference reducing means of the present invention.

Figure 3:
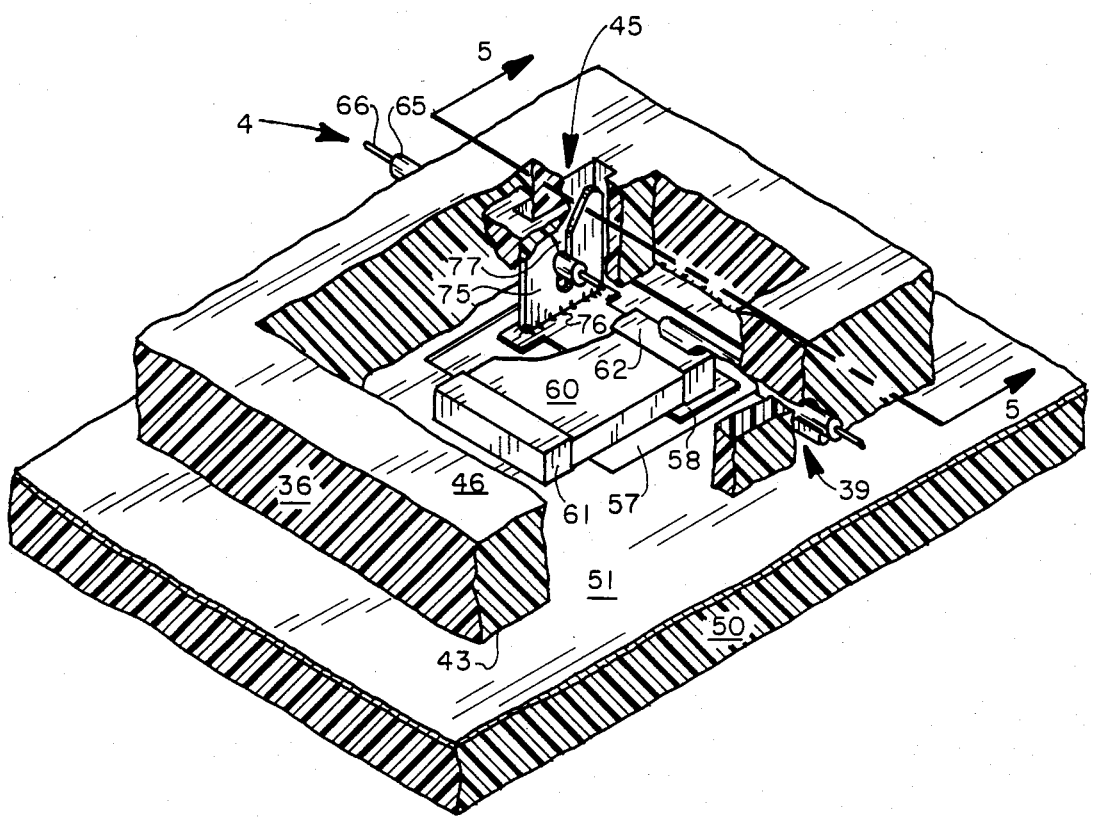
FIG. 3 is a perspective view of a second embodiment showing an insulation displacing terminal arrangement for connecting the conductors to the capacitors.

Referring now to FIG. 3, there as shown an alternate embodiment connecting the metallic conductor 66 of the conductor 4 to the second terminal 62 of the capacitor 60 without the necessity of stripping away the insulation 65. In this embodiment, an insulation displacing terminal 75 is included attached to the pad 58 by known means such as a solder connection 76. The terminal 75 is adapted to receive in a slot 77 formed therein the metallic conductor 66 of the cable conductor 4. The aperture 45 formed in the alignment guide 13 is repositioned to surround the insulation displacing terminal 75 and provide clearance for the terminal. A capacitor receiving cavity 78 is formed in the inner surface 43 of the wire alignment guide 36 to provide clearance for capacitor 60 when the guide is assembled to the support plate 50.

The present invention may be operated to utilize the insulation displacing terminals 75 of the present embodiment by passing the cable 3 through the enclosure wall 1, the housing 5 and terminating it as described above. The cable conductors 4 are then exposed and separated also as described above. The conductors 4 are then positioned, without being stripped of their insulation 65, directly into the conductor guide slots 39 of the wire alignment guides 36 and 37 and the guides assembled about a subassembly consisting of the support plane 50, the conductive layers 51 and 53, the capacitors 60, the pads 58 and the insulation displacing terminals 75. As the guides are pressed together about the subassembly, the slots 39 will force the wires into the slots 77 in the insulation displacing terminal 75 thereby displacing the insulation 65 and establishing electrical connection between the metallic conductor 66 of the cable conductors 4 and the capacitors second end 62.

Figure 4:
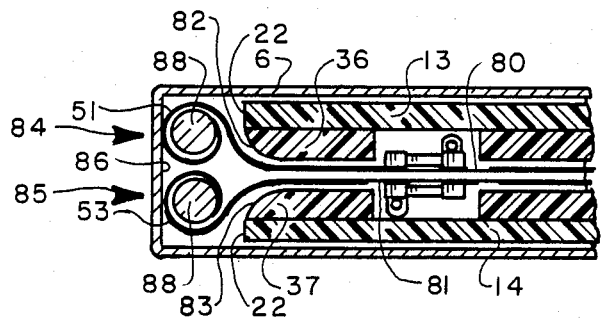
FIG. 4 is a cross sectional view taken along the line 4—4 in FIG. 1 showing an alternate arrangement for connecting the conductive layer to the housing sleeve.

Referring now to FIG. 4 there is shown the present invention including an alternate-embodiment connecting the conductive layers 51 and 53 to the housing sleeve 6. In this embodiment, a pair of flexible sheets 80 and 81 are utilized in place of the rigid supporting plane 50 of FIG. 1. In this regard, the conductive layer 51 is formed on the flexible sheet 80 and the conductive layer 53 is formed on the flexible layer 81. The flexible sheets 80 and 81 and conductive layers 51 and 53 extend laterally beyond the edges of the alignment guides 36 and 37 which are provided with curvedly diverging surfaces 82 and 83, respectively. The sheets 80 and 81 are formed in rolls 84 and 85, each formed in a curvedly diverging manner following the surface 82 or 83 as may be appropriate and then formed in a circular roll (84 and 85) in a direction toward the other sheet to bring the conductive layers 51 and 53 into contact with each other and with an inner surface 86 of the sleeve 6. To retain the conductive layers 51 and 53 in contact with each other and with the inner surface 86 of the sleeve 6 there is provided within each roll a resilient rod 88. The rod 88 may be constructed any resilient electrically insulating material such as foamed rubber or plastic and may be of circular cross section as shown or of other cross section such as oval, square, rectangular, or triangular cross section. The rod 88 serves to resiliently increase the diameter of the rolls 84 and 85 causing the rolls to expand between the inner surface 86 of the sleeve 6 and the side surface 22 of the enclosure upper half 13 and enclosure lower half 14, and also adjacent the curved diverging surfaces 82 and 83 of the alignment guides 36 and 37, respectively.

Figure 5:
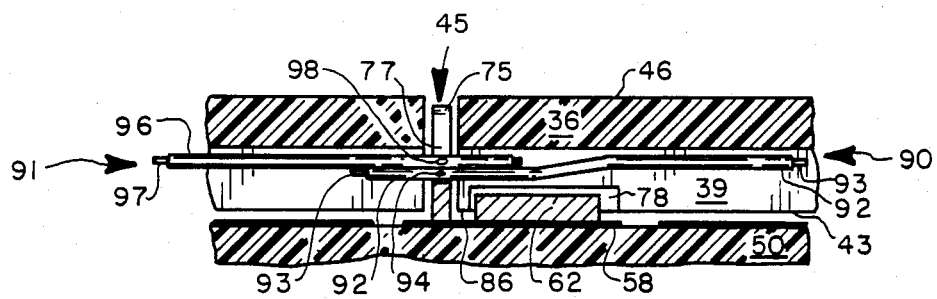
FIG. 5 is a cross sectional view taken along the line 5—5 in FIG. 3 showing the use of insulation displacing terminals to provide connection to the interference reducing capacitors and simultaneously to splice two separate conductors together.

Referring to FIG. 5, there as shown an alternate embodiment of the present invention wherein the splicing of two cables and the establishing connection to the electromagnetic interference reducing capacitors is provided. In this regard, there is shown a conductor 90 of a first cable and a second conductor 91 of a second cable, which conductors are to be joined electrically and connected electrically to an electromagnetic interference reducing capacitor second terminal 62 using an insulation displacing terminal 75 connected to the capacitor terminal 62 by means of a conductive pad 86. The cables may be connected to equipment either within or outside of the equipment enclosure as desired.

The present embodiment is operated by placing the first conductor 90 in the conductor receiving slot 39 of the alignment guide 36 and assembling the guide to the support plate 50 in such a manner that the insulation displacing terminal 75 engages the aperture 45 in the guide. Pressure on the alignment guide 36 in a direction towards the support plate 50 will force the conductor 90 into the slot 77 of the insulation displacing terminal 75 thereby displacing the insulation 92 of the first conductor 90 and exposing the metallic core 93 to form a pair of contact points 94 on opposite sides of the conductor 90. The alignment guide 13 is then removed and the second conductor 91 placed in the conductor guide slot 39 after which the alignment guide is again assembled to the support plate 50 as described above thereby forcing second conductor 91 into the insulation displacing terminal slot 77 thereby displacing the insulation 96 of the second conductor 91 and exposing the metallic core 97 to form a second pair of contact points 98 on opposite sides of the conductor 91.

Alternately, the conductors 91 and 90 may both be placed in the slot 39 and the alignment guide 36 assembled to the support plate 50 to sequentially connect the conductors 90 and 91 to the insulation displacing terminal 75 in one assembly operation.

Although the preferred embodiments of the preferred invention have been illustrated in their forms described in detail, it will be readily apparent to those skilled in the art and various modification may be made therein without departing from the spirit of the invention or from the scope of the appended claims.

What is claimed is;

1. An assembly to prevent electromagnetic interference generated by equipment within an enclosure from passing out of said enclosure on a cable, including a plurality of electrical conductors connected to said equipment and passing from within to outside of said enclosure, said assembly comprising;
   a support means of nonelectrically conductive construction and including at least a first surface;
   at least one conductive layer formed on said first surface;
   a plurality of electromagnetic interference reducing means, each including a first terminal connected to said conductive layer and a second terminal connected to a different one of said electrical conductors; and
   an electrically conductive housing removably containing therein said support means, said conductive layer and said interference reducing means, said housing electrically connected to said conductive layer and to said enclosure.

2. An assembly as claimed in claim 1, wherein: said enclosure includes a wall, and said housing includes a wall mounting plate and a sleeve, said plate including a first side, a second side and an aperture, said sleeve connected to said plate second side, said aperture extending between said first side and an inner area of said sleeve and of a size and a shape to closely conform to an outer surface of said cable, and said plate first side removably attached to an inner surface of said wall, said support means, said conductive layer and said interference reducing means removably received within said sleeve inner area.

3. An assembly as claimed in claim 2, wherein: said sleeve is of rectangular cross section.

4. An assembly as claimed in claim 1, wherein: said enclosure includes an opening through which said electrical conductors are passed and said housing is removably attached to said enclosure through the use of fasteners, said opening of enlarged dimensions and shaped to permit cable passage there through with ease, and said housing attached to and electrically connected to said enclosure to electromagnetically seal said enlarged enclosure opening to reduce the leakage of electromagnetic interference from said enclosure.

5. An assembly as claimed in claim 1, wherein: said support means is of rigid planar construction and said conductive layer is electrically connected to said housing by a wire conductor.

6. An assembly as claimed in claim 1, wherein: said interference reducing means includes a capacitor.

7. An assembly as claimed in claim 1, wherein: said interference reducing means first terminal is connected to said conductive layer by means of a soldered connection.

8. An assembly as claimed in claim 1, wherein: said interference reducing means second terminal is connected to said respective conductor by means of a soldered connection.

9. An assembly as claimed in claim 1, wherein: said assembly further includes an insulation displacing terminal connected to said interference reducing means second terminal, said respective conductor connected to said interference reducing means second terminal by means of said insulation displacing terminal.

10. An assembly as claimed in claim 9, wherein: said cable includes a first portion connected between said equipment and said assembly and a second separate portion connected to said assembly and passing out of said enclosure, both said cable portions including a plurality of corresponding conductors, said insulation displacing terminal connected to said corresponding first portion and second portion cable conductors to splice together and establish connection between said conductors.

11. An assembly as claimed in claim 1, wherein: said assembly includes an alignment means of nonconductive planar construction including a plurality of conductor receiving slots in a first surface thereof facing said support means, said slots opened to said surface, said conductors positioned within a respective one of said conductor receiving slots and said alignment means engaging said support means to position each of said conductors in contact with said corresponding interference reducing means second terminal.

12. An assembly as claimed in claim 11, wherein: said alignment means includes a second surface parallel to and spaced apart from said first surface and plurality of apertures each intersecting a respective one of said conductor receiving slots, said apertures extending from said first surface to said second surface and positioned to surround a respective one of said interference reducing means, said apertures each permitting access to said conductor and said interference reducing means second terminals to permit the establishment of an electrical connection between said conductor and said interference reducing means second terminal.

13. An assembly as claimed in claim 11, wherein: said assembly includes a plurality of insulation displacing terminals each connected to a different one of said interference reducing means second terminals, said alignment means includes a second surface parallel to and spaced apart from said first surface, said alignment means further including a plurality of apertures each intersecting a respective one of said conductor receiving slots and extending from said alignment means first surface to said second surface, said apertures each positioned to encircle a respective one of said insulation displacing terminals, said respective conductors forced into electrical contact with said insulation displacing terminals in response to said alignment means being assembled to said support means.

14. An assembly as claimed in claim 1, wherein: said assembly includes a plurality of insulation displacing terminals each electrically connected to a respective one of said interference reducing means second terminals, said respective electrical conductors each forced into a respective one of said terminals to establish electrical contact between said conductors and said respective interference reducing means.

15. An assembly as claimed in claim 14, wherein: said conductors each extend from a respective one of said insulation displacing terminals to said enclosure located equipment and said assembly further includes a plurality of associated conductors connected to external apparatus, said associated conductors inserted into a respective one of said conductor receiving slots to engage and connect said associated conductors with said insulation displacing terminals to thereby splice said conductors to said associated conductors.

16. An assembly as claimed in claim 3, wherein: said assembly includes an enclosure of split rectangular nonconductive construction sized to fit closely within said housing sleeve, said enclosure split into a pair of identical halves each including an inner surface adjacent to the other inner surface, said inner surfaces each including a first and second pair of opposite parallel edges, said first pair of said edges adapted to receive said cable passing from said equipment out of said enclosure and a support means receiving channel laterally cut relative to said cable in said inner surfaces between said second pair of opposite edges of said inner surface, said support means, said conductive layer, and said interference reducing means received within said channel.

17. An assembly as claimed in claim 16, wherein: said support means is of flexible planar construction and extends along with said conductive layer laterally of said cable forming a flexible roll, said conductive layer engaged with an interior surface of said sleeve, a resilient rod included centrally within said roll, said rod urging said conductive layer into electrical contact with said housing interior surface.

18. An assembly as claimed in claim 16, wherein: said enclosure includes a pair of cable clamps formed in said inner surfaces immediately inside each of said first pair of parallel edges and a wire distribution channel formed immediately inside of said cable clamps, said respective cable clamps adapted to receive and grip said cable from said equipment and said cable passing out of said enclosure, said distribution channels providing space to distribute said conductors between said respective cable clamps and said respective electromagnetic interference reducing means.

19. An assembly as claimed in claim 1, wherein: said support means includes a second side, and said assembly includes a second conductive layer formed on said second side and a second plurality of interference reducing means, said interference reducing means connected to said second conductive layer by a first terminal and including a second terminal, said plurality of conductors connected to corresponding ones of said first and said second pluralities of interference reducing means second terminals.

20. An assembly as claimed in claim 14, wherein: said conductive layer includes a plurality of apertures spaced about said surface and about respective ones of said interference reducing means second terminals, and said assembly further includes a plurality of conductive pads each formed on said surface, and within said plurality of conductive layer apertures, said pads electrically insulated from said conductive layer, respective ones of said pads connected to corresponding ones of said interference reducing means second terminals to provide structural support therefor.

* * * * *